(12) United States Patent
Arai et al.

(10) Patent No.: US 8,193,532 B2
(45) Date of Patent: Jun. 5, 2012

(54) THIN FILM INTEGRATED CIRCUIT DEVICE, IC LABEL, CONTAINER COMPRISING THE THIN FILM INTEGRATED CIRCUIT, MANUFACTURING METHOD OF THE THIN FILM INTEGRATED CIRCUIT DEVICE, MANUFACTURING METHOD OF THE CONTAINER, AND MANAGEMENT METHOD OF PRODUCT HAVING THE CONTAINER

(75) Inventors: Yasuyuki Arai, Atsugi (JP); Akira Ishikawa, Atsugi (JP); Toru Takayama, Atsugi (JP); Junya Maruyama, Ebina (JP); Yuugo Goto, Atsugi (JP); Yumiko Ohno, Atsugi (JP); Yuko Tachimura, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/115,133

(22) Filed: May 25, 2011

(65) Prior Publication Data

US 2011/0223966 A1  Sep. 15, 2011

Related U.S. Application Data

(63) Continuation of application No. 10/781,795, filed on Feb. 20, 2004, now Pat. No. 7,973,313.

(30) Foreign Application Priority Data

Feb. 24, 2003 (JP) .................................. 2003-046456

(51) Int. Cl.
*H01L 27/12* (2006.01)
*H01L 29/66* (2006.01)

(52) U.S. Cl. .................. 257/66; 257/E27.111; 257/E29; 257/295

(58) Field of Classification Search .................... 257/66, 257/E27.111, E29.295; 174/250, 260
See application file for complete search history.

(56) References Cited

U.S. PATENT DOCUMENTS 4,900,695 A 2/1990 Takahashi et al.
(Continued)

FOREIGN PATENT DOCUMENTS

CN  1073300  6/1993
(Continued)

OTHER PUBLICATIONS

"*Sense of Crisis is a Trigger*": *Ignited Evolution of a Sesame-Grain Sized Chip*, Nikkei Electronics, Nikkei Business Publications, Nov. 18, 2002, pp. 67-76.

(Continued)

*Primary Examiner* — Colleen Matthews
(74) *Attorney, Agent, or Firm* — Eric J. Robinson; Robinson Intellectual Property Law Office, P.C.

(57) ABSTRACT

The present invention provides an ultrathin thin film integrated circuit and a thin film integrated circuit device including the thin film integrated circuit device. Accordingly, the design of a product is not spoilt while an integrated circuit formed from a silicon wafer, which is thick and produces irregularities on the surface of the product container. The thin film integrated circuit according to the present invention includes a semiconductor film as an active region (for example a channel region in a thin film transistor), unlike an integrated circuit formed from a conventional silicon wafer. The thin film integrated circuit according to the present invention is thin enough that the design is not spoilt even when a product such as a card or a container is equipped with the thin film integrated circuit.

24 Claims, 10 Drawing Sheets

U.S. PATENT DOCUMENTS

| | | | |
|---|---|---|---|
| 5,347,154 A | 9/1994 | Takahashi et al. |
| 5,486,708 A | 1/1996 | Takahashi et al. |
| 5,572,045 A | 11/1996 | Takahashi et al. |
| 5,618,739 A | 4/1997 | Takahashi et al. |
| 5,643,804 A | 7/1997 | Arai et al. |
| 5,728,591 A | 3/1998 | Takahashi et al. |
| 5,773,327 A | 6/1998 | Yamazaki et al. |
| 5,985,741 A | 11/1999 | Yamazaki et al. |
| 6,004,831 A | 12/1999 | Yamazaki et al. |
| 6,127,199 A | 10/2000 | Inoue et al. |
| 6,133,835 A | 10/2000 | De Leeuw et al. |
| 6,232,621 B1 | 5/2001 | Yamazaki et al. |
| 6,312,795 B1 | 11/2001 | Yamamoto |
| 6,313,481 B1 | 11/2001 | Ohtani et al. |
| 6,331,722 B1 | 12/2001 | Yamazaki et al. |
| 6,372,608 B1 | 4/2002 | Shimoda et al. |
| 6,413,842 B2 | 7/2002 | Yamazaki et al. |
| 6,436,520 B1 | 8/2002 | Yamamoto |
| 6,509,217 B1 | 1/2003 | Reddy |
| 6,528,382 B2 | 3/2003 | Yamauchi et al. |
| 6,559,905 B1 | 5/2003 | Akiyama |
| 6,566,235 B2 | 5/2003 | Nishida et al. |
| 6,596,571 B2 | 7/2003 | Arao et al. |
| 6,621,099 B2 | 9/2003 | Ong et al. |
| 6,645,830 B2 | 11/2003 | Shimoda et al. |
| 6,646,711 B2 | 11/2003 | Sugano |
| 6,703,267 B2 | 3/2004 | Tanabe et al. |
| 6,720,577 B2 | 4/2004 | Arao et al. |
| 6,729,922 B2 | 5/2004 | Hiroki |
| 6,753,253 B1 | 6/2004 | Takahashi et al. |
| 6,765,270 B2 | 7/2004 | Chae |
| 6,770,904 B2 | 8/2004 | Ong et al. |
| 6,777,529 B2 | 8/2004 | Ong et al. |
| 6,795,339 B2 | 9/2004 | Ooishi |
| 6,806,918 B2 | 10/2004 | Akiyama |
| 6,814,832 B2 | 11/2004 | Utsunomiya |
| 6,821,348 B2 | 11/2004 | Baude et al. |
| 6,828,604 B2 | 12/2004 | Inoue |
| 6,850,080 B2 | 2/2005 | Hiroki |
| 6,878,643 B2 | 4/2005 | Krulevitch et al. |
| 6,885,032 B2 | 4/2005 | Forbes et al. |
| 6,887,650 B2 | 5/2005 | Shimoda et al. |
| 6,891,391 B2 | 5/2005 | Hiroki |
| 6,900,861 B2 | 5/2005 | Yasui |
| 6,921,917 B2 | 7/2005 | Choi et al. |
| 6,946,361 B2 | 9/2005 | Takayama et al. |
| 6,979,840 B1 | 12/2005 | Yamazaki et al. |
| 7,005,671 B2 | 2/2006 | Yamazaki et al. |
| 7,042,052 B2 | 5/2006 | Bhattacharyya |
| 7,050,125 B2 | 5/2006 | Akiyama |
| 7,060,153 B2 | 6/2006 | Yamazaki et al. |
| 7,063,999 B2 | 6/2006 | Tanabe et al. |
| 7,067,843 B2 | 6/2006 | Carcia et al. |
| 7,088,145 B2 | 8/2006 | Baude et al. |
| 7,105,365 B2 | 9/2006 | Hiroki et al. |
| 7,180,091 B2 | 2/2007 | Yamazaki et al. |
| 7,180,093 B2 | 2/2007 | Takayama et al. |
| 7,202,495 B2 | 4/2007 | Unno |
| 7,285,476 B2 | 10/2007 | Shimoda et al. |
| 7,332,381 B2 | 2/2008 | Maruyama et al. |
| 7,396,712 B2 | 7/2008 | Tanabe et al. |
| 7,442,957 B2 | 10/2008 | Yamazaki et al. |
| 7,482,620 B2 | 1/2009 | Kugler et al. |
| 7,518,692 B2 | 4/2009 | Yamazaki et al. |
| 7,532,018 B2 | 5/2009 | Hiroki |
| 7,642,584 B2 | 1/2010 | Yamazaki et al. |
| 7,652,359 B2 | 1/2010 | Takayama et al. |
| 7,674,635 B2 | 3/2010 | Hiroki et al. |
| 2001/0045559 A1 | 11/2001 | Yamazaki et al. |
| 2002/0094639 A1 | 7/2002 | Reddy |
| 2003/0032210 A1 | 2/2003 | Takayama et al. |
| 2004/0053480 A1 | 3/2004 | Tanabe et al. |
| 2005/0106839 A1 | 5/2005 | Shimoda et al. |
| 2005/0218926 A1 | 10/2005 | Hiroki |
| 2010/0006776 A1 | 1/2010 | Tanabe et al. |

FOREIGN PATENT DOCUMENTS

| | | |
|---|---|---|
| CN | 1256510 | 6/2000 |
| CN | 1282050 | 1/2001 |
| EP | 0295065 A | 12/1988 |
| EP | 0 486 318 | 5/1992 |
| EP | 0 858 110 | 8/1998 |
| EP | 1 081 721 | 3/2001 |
| EP | 1271398 A | 1/2003 |
| EP | 1 455 394 | 9/2004 |
| JP | 61-206304 | 9/1986 |
| JP | 09-270515 | 10/1997 |
| JP | 10-125929 | 5/1998 |
| JP | 10-125930 | 5/1998 |
| JP | 10-125931 | 5/1998 |
| JP | 10-256576 | 9/1998 |
| JP | 11-134460 | 5/1999 |
| JP | 11-142878 | 5/1999 |
| JP | 11-243209 | 9/1999 |
| JP | 2001-007340 | 1/2001 |
| JP | 2001-051296 | 2/2001 |
| JP | 2001-166301 | 6/2001 |
| JP | 2001-176896 | 6/2001 |
| JP | 2001-217443 | 8/2001 |
| JP | 2001-331120 | 11/2001 |
| JP | 2002-087844 | 3/2002 |
| JP | 2002-133385 | 5/2002 |
| JP | 2002-164512 | 6/2002 |
| JP | 2002-184959 | 6/2002 |
| JP | 2002-230141 | 8/2002 |
| JP | 2002-278473 | 9/2002 |
| JP | 2002-353235 | 12/2002 |
| JP | 2003-016412 | 1/2003 |
| JP | 2003-044808 | 2/2003 |
| JP | 2003-045890 | 2/2003 |
| TW | 488079 | 5/2002 |
| TW | 504845 | 10/2002 |
| WO | WO 03/010825 | 2/2003 |

OTHER PUBLICATIONS

Office Action (Application No. 200410007026.5) dated Apr. 20, 2007.
Office Action (Application No. 93104458) dated Mar. 22, 2010.
Chinese Office Action (Application No. 200410007026.5) dated Aug. 3, 2010.
European Search Report (Application No. 04004083.4) Dated Jul. 6, 2011.
"Sense of Crisis" is a Trigger. Ignited Evolution of a Sesame-Grain Sized Chip Technology Development is Entering into the Second Phase Nikkei Electronics, Nikkei Business Publications, Nov. 18, 2002, No. 835, pp. 67-76.

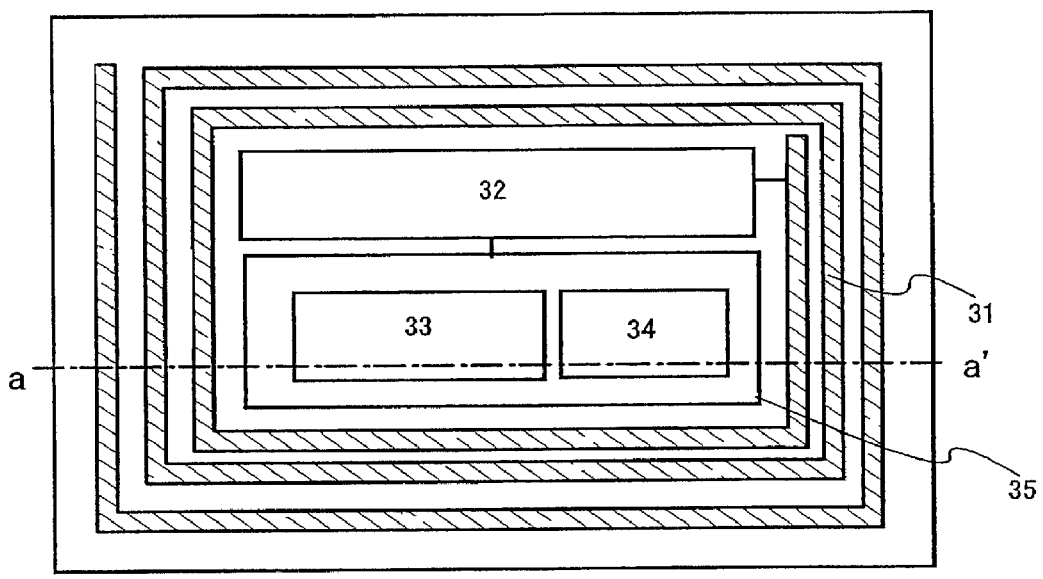
F I G. 3

F I G. 5
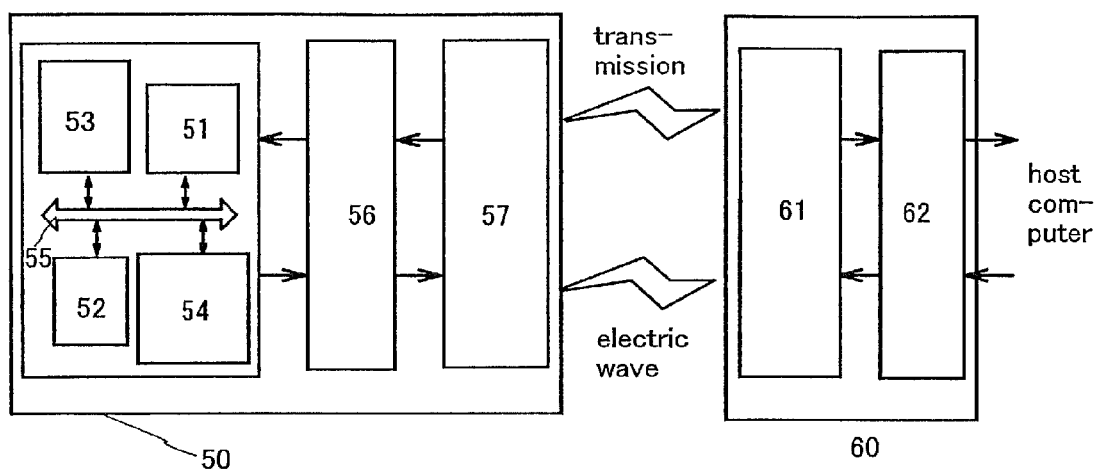

F I G. 7A
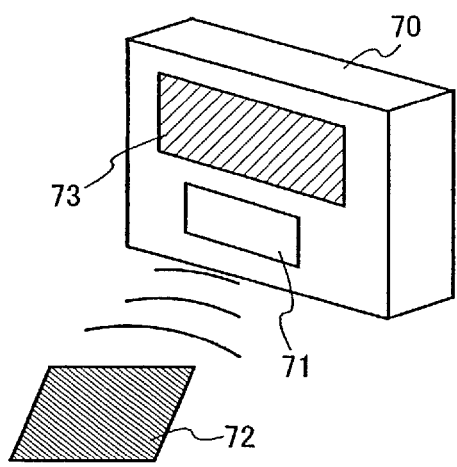
F I G. 7B
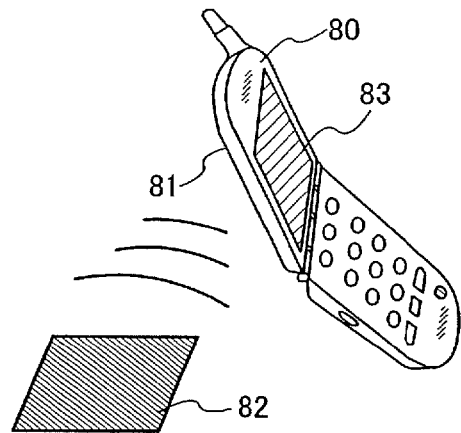
F I G. 7C
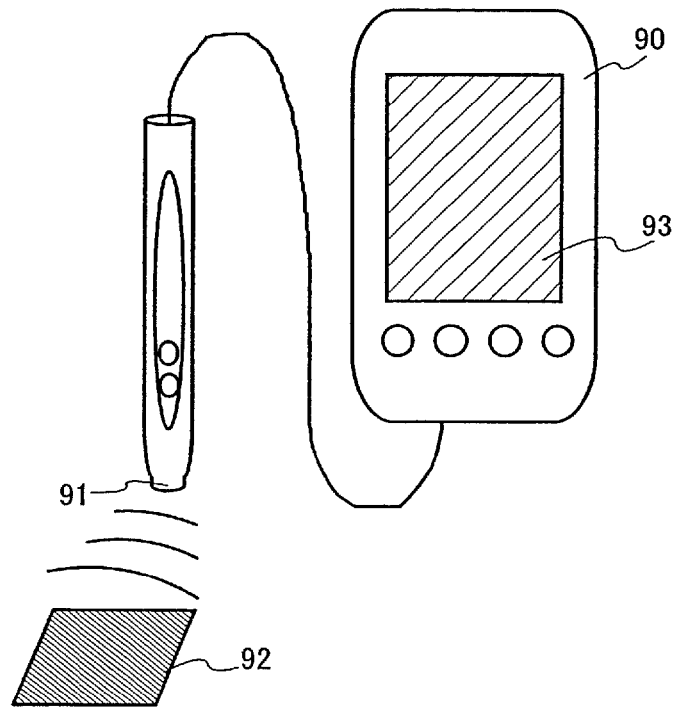

F I G. 9
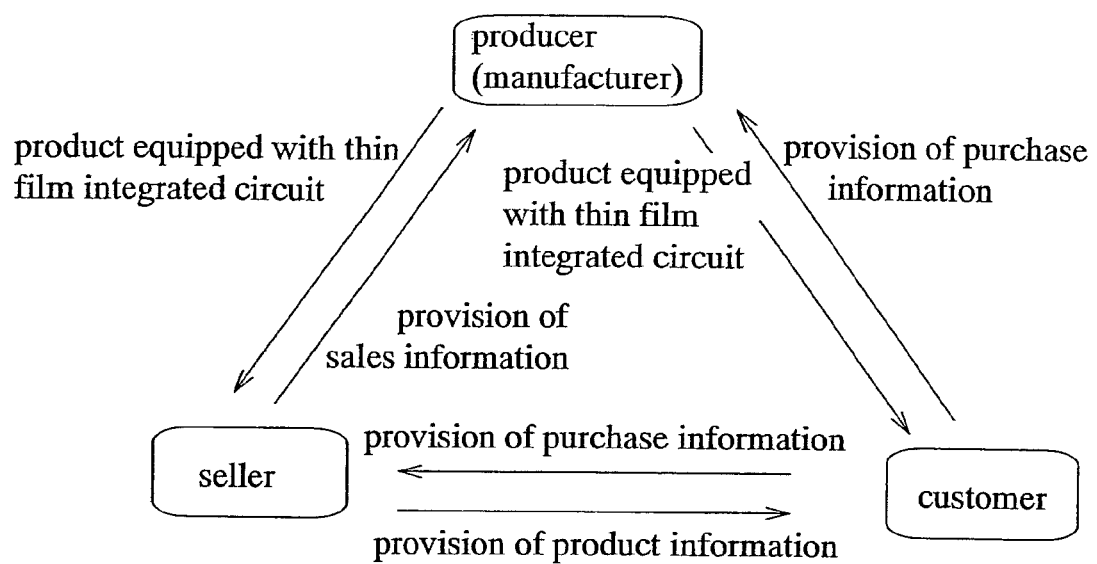

THIN FILM INTEGRATED CIRCUIT DEVICE, IC LABEL, CONTAINER COMPRISING THE THIN FILM INTEGRATED CIRCUIT, MANUFACTURING METHOD OF THE THIN FILM INTEGRATED CIRCUIT DEVICE, MANUFACTURING METHOD OF THE CONTAINER, AND MANAGEMENT METHOD OF PRODUCT HAVING THE CONTAINER

BACKGROUND OF THE INVENTION

1. Field of the Invention

The present invention relates to a thin film integrated circuit device equipped with a thin film integrated circuit that is flexible and paper-thin that has a memory and a microprocessor (central processing unit (CPU)); an integrated circuit (IC) label using a thin film integrated circuit device for a label; a product container including the thin film integrated circuit; and manufacturing methods thereof. The present invention further relates to management methods of the products above.

2. Description of the Related Art

In late years, the number of cards that a person owns is increasing. Every kind of information is recorded in cards and is renewed as necessary. The amount of recorded information is progressively increasing.

Such increase in the amount of information is essential in various fields. For example, in the food industry and manufacturing industry, as improvements in the product safety and the administrative structure are required, the amount of information on the products is increased accordingly. However, the current products information is exceedingly little, as a country of manufacture, a maker, a product number which are mainly provided by using bar codes containing figures of over ten columns. Further, when bar codes are used, it requires time to manually read each product.

Considering the above, a reference describes a method of managing product using networks is devised. Using this method, the information on products is transferred to stores via a server by inputting identifiers of products with a network terminal in each store. The identifiers of products are shown with two-dimensional bar codes or character strings, and are sent to a server after they are inputted into terminals in stores. The products have a detachable storage medium that holds programs and data on products, or personal information. Cards such as an IC card, a smart card, and a compact flash card are given as examples of the storage medium (Reference 1: Japanese Patent Laid-Open No. 2002-230141).

As an alternative, a unique identification number is assigned to each food sold in retail stores, and consumers can browse materials for foods, producers, and distribution channels by accessing the Internet. In this case, required product information is provided in response to inquiries by using a server or software for processing information read by a reader/writer, thereby improving the efficiency of productivity and distribution. Thus, the versatility of systems related to RFID IC tags is expanded (Reference 1: Nikkei Electronics, Nikkei Business Publications, pp. 67-76, Nov. 18, 2002).

When the information management is performed by using bar codes according with such increase in information, the amount of information which can be provided is limited. It is inefficient spending time for reading manually, in addition to the lack of information. Further, reading errors due to the manual operation of bar code reading can not be avoided.

Concerning the above reference in particular, there are problems that consumers spend time to access the Internet and that they must have their own personal computers. Further, since the integrated circuit including a silicon wafer, which is applied to an RFID IC tags is thick that, irregularities are produced on the surface of the container, and the design is spoilt when the tag is mounted on a product container.

Accordingly, it is an object of the present invention to provide an integrated circuit (IC) that can store much information, which is far thinner than a conventional silicon wafer (a thin film integrated circuit) and to provide a thin film integrated circuit device having the thin film integrated circuit. It is a specific object of the present invention to equip a label (IC label) with the thin film integrated circuit, to provide a product container whose design is not spoiled, and a manufacturing method of the label and container. It is a further object of the present invention to provide a management method of the products which is loaded with the IC label.

In view of the foregoing, the present invention provides a thin film integrated circuit device (for example, IC label) equipped with an integrated circuit (IC) (thin film integrated circuit) that is thin like paper. The thin film integrated circuit according to the present invention includes a semiconductor film as an active region (for example, a thin film transistor as a channel region), unlike a conventional integrated circuit (IC) formed from a silicon wafer.

Such an IC can generally store data of around 5 kilobytes or more whereas the data that can be stored magnetically is few around dozens of bytes; the IC can save by far greater capacitance. Therefore, a large quantity of information can be provided in all area in comparison with bar codes. For example, in the case of using the thin film integrated circuit device in which a thin film integrated circuit is installed in a card, the efficiency of information management can be improved since a large quantity of information can be stored. By employing the thin film integrated circuit, a plurality of cards no longer needs to be carried and will be replaced by a single card. In addition, a thin film integrated circuit device that can rewrite information as necessary can be provided by equipping the thin film integrated circuit with a rewritable memory.

Further, most of cards are required to have advanced security and high reliability. The thin film integrated circuit has advantages that the data cannot be read unlike magnetism and that the stored data is hard to be falsified. In other words, the security of stored information can be ensured. In addition, an alert can be raised to prevent shoplifting or theft by installing the IC.

The present invention provides a label (an IC label) using the ultrathin thin film integrated circuit which does not spoil the design of a product, and a product container each equipped with the IC label.

As for a specific IC label, as shown in FIG. 6A, an IC label 15 is formed by sticking (affixing) and fixing a thin film integrated circuit 12 to the back of a label 11 that is adhered to a product 10 as typified by a bottle or a card. A thin film integrated circuit according to the present invention is by far thinner compared with an IC formed from a silicon wafer since it is formed from a semiconductor film with a thickness of around 500 nm. Therefore, the design of a product is not spoiled even when the thin film integrated circuit including a semiconductor film according to the present invention is used for a label of a product.

FIG. 6B is a cross section of the product 10 in FIG. 6A taken along the line a-a'. Shown here is a thin film integrated circuit device, specifically an IC label which is adhered and fixed to a product with an adhesive agent 14 and in which a thin film integrated circuit according to the present invention is disposed on the back of the label. Note that, when the label 11 is adhesive, the adhesive agent 14 is not necessary. FIG. 6C is a cross section of the product 10 in FIG. 6A taken along the line a-a'. Shown here is a thin film integrated circuit device, specifically an IC label which is adhered and fixed to a product and which is in a state where a thin film integrated circuit according to the present invention is sandwiched (held) between labels. Labels 11 each have an adhesive face that is in contact with a film integrated circuit and another adhesive face that is in contact with the product. When the labels are not adhesive, an adhesive agent may be used. The IC label may be completed by directly transferring the thin film integrated circuit to a product and by pasting a label thereover.

Thus, the present invention provides a thin film integrated circuit device (specifically, an IC label) having an ultrathin thin film integrated circuit and products equipped therewith. Various methods may be used to fix the thin film integrated circuit.

Such an IC label enables merchandise management such as supply management, inventory management, grip of work schedule, or grip of delivery schedule, or improvements in efficiency of distribution management such as sales channel management. Further, a large amount of information on a product, such as a material, the place of origin, a test result of each production process, or a record of distribution process can be managed and provided to consumers.

Since the thin film integrated circuit according to the present invention as described above is greatly thin, the design is not spoiled even if it is mounted to products such as cards and containers. Further, by far larger amount of information can be stored compared with bar codes and magnetism. The thin film integrated circuit according to the present invention can arbitrarily be employed for a contact IC or a contactless IC.

BRIEF DESCRIPTION OF THE DRAWINGS

FIG. 3 shows details of a contactless thin film integrated circuit according to the present invention.

FIG. 5 shows the principle of a contactless thin film integrated circuit according to the present invention.

FIGS. 7A to 7C show reader/writers of contactless thin film integrated circuits according to the present invention.

FIG. 9 shows the relationship between a producer, a seller, and a consumer.

DETAILED DESCRIPTION OF THE PREFERRED EMBODIMENTS

Figure 1A:
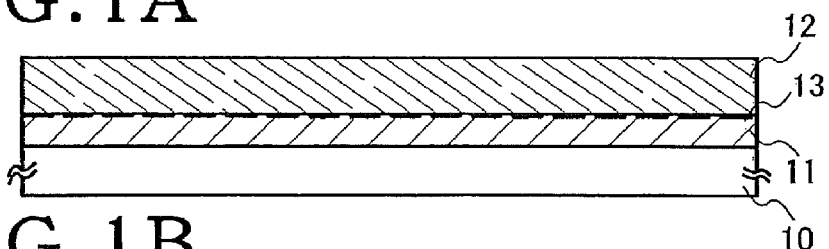
FIGS. 1A to 1E show a manufacturing method of a thin film integrated circuit according to the present invention.

Hereinafter, embodiment modes of the present invention will be described according to the accompanying drawings. Note that, in all figures for explaining the embodiment modes, the same reference numerals are referred to the same portions or parts, which have similar functions, and the description thereof will not be further repeated.

Embodiment Mode 1

In this embodiment mode, a manufacturing method of a thin film integrated circuit according to the present invention using techniques of delamination and transfer will be described.

First, a metal film 11 is formed over a first substrate 10 as shown in FIG. 1A. Note that any substrate that has rigidity for withstanding the following lamination process, for example, a glass substrate, a quartz substrate, a ceramic substrate, a silicon substrate, a metal substrate, or a stainless substrate, can be used for the first substrate. A single layer or a laminate of an element selected from the group consisting of W, Ti, Ta, Mo, Nd, Ni, Co, Zr, Zn, Ru, Rh, Pd, Os, and Ir; an alloy material or a compound material which mainly includes the element can be used for the metal film. For example, the metal film can be formed by sputtering using a metal target. Note that, the film thickness of the metal film may be 10 nm to 200 nm, preferably be 50 nm to 75 nm.

Instead of the metal film, a film in which the above metal is nitrided (for example, a tungsten nitride film or a molybdenum nitride film) may be used. Alternatively, a metal alloy of the metal (for example, an alloy of W and Mo: $W_xMo_{1-x}$) may be used for the metal film. In that case, sputtering may be performed by using plural targets disposed in a film formation chamber, such as a first metal (W) and a second metal (Mo), or a target of an alloy of the first metal (W) and the second metal (Mo). Still further, nitrogen and oxygen may be added to the metal film. For example, ion implantation of nitrogen or oxygen to the metal film may be performed, or the metal film may be formed by sputtering in a film formation chamber, inside of which shall be a nitrogen or oxygen atmosphere. Nitride metal may be used for a target here.

When the metal film is formed by sputtering, the film thickness of the periphery of the substrate occasionally becomes uneven. Therefore, it is preferable to remove the periphery portion of a film by dry etching. On that occasion, an insulating film such as a silicon oxynitride (SiON or SiNO) film may be formed into approximately 100 nm between the first substrate 10 and the metal film 11 so that the first substrate is not etched.

By employing the method of forming a metal film as above, the delamination process can be controlled, and a range of process is broadened. Accordingly, for example, when a metal alloy is used, the delamination process can be controlled by controlling the composition ratio of each metal in the alloy. Specifically, the temperature of heat treatment for the delamination and use or disuse of heat treatment can also be controlled.

A delamination layer 12 is formed over the metal film 11. The delamination layer has an oxide film containing silicon, and a semiconductor film. An antenna may be provided when a contactless IC is formed. It is preferable that an insulating film containing nitrogen such as a silicon nitride (SiN) film or a silicon oxynitride (SiON or SiNO) film be provided as a base film in a layer lower than the delamination layer 12 particularly lower than the semiconductor film thereby preventing impurities or dusts from penetrating the metal film or the substrate.

Silicon oxide, silicon oxynitride, or the like may be formed as an oxide film containing silicon by sputtering or CVD. Note that the thickness of the oxide film containing silicon is preferably more than twice as thick as that of the metal film. In this embodiment mode, a silicon oxide film is formed with a film thickness of 150 nm to 200 nm by sputtering using a silicon target.

When the oxide film containing silicon is formed, an oxide (metal oxide) 13 including the metal is formed over the metal film. The metal oxide film may be formed form a thin metal oxide layer that is formed over the surface of the metal film by processing an aqueous solution having sulfuric acid, hydrochloric acid or nitric acid; an aqueous solution in which sulfuric acid, hydrochloric acid or nitric acid and hydrogen peroxide water are mixed; or ozone aqua. As another alternative, oxidation may be performed by plasma treatment in an oxygen atmosphere or by generating ozone with ultraviolet irradiation in an oxygen containing atmosphere, or by heat treatment approximately at 200° C. to 350° C. with a clean oven may be performed thereby forming the metal oxide film.

The metal oxide may be formed so as to have a thickness of 0.1 nm to 1 µm, preferably 0.1 nm to 100 nm, more preferably 0.1 nm to 5 nm.

Note that the oxide film containing silicon and the base film which are provided between the semiconductor film and the metal film are collectively referred to as an insulating film. Accordingly, a structure in which the metal film, the metal oxide, the insulating film, and the semiconductor film are sequentially laminated may be employed. Namely, a structure in which a semiconductor film is provided over one side of the insulating film and the other side of the insulating film is provided with the metal oxide and the metal film may be employed.

Semiconductor elements such as a thin film transistor (TFT) an organic TFT, a thin film diode, and the like are formed by applying a predetermined fabrication process on the semiconductor film. Those semiconductor elements form a CPU or a memory of the thin film integrated circuit. It is preferable to provide a protective film containing carbon such as a diamond like carbon (DLC) film or a carbon nitride (CN) film, or a protective film containing nitrogen such as a silicon nitride (SiN) film or a silicon oxinitride (SiNO or SiON) film over the semiconductor elements. A protective film containing carbon and a protective film containing nitrogen may be laminated alternatively.

After forming the delamination layer as described above; specifically, after the metal oxide is formed, heat treatment is performed to crystallize the metal oxide. For example, when W (tungsten) is used for the metal film, a metal oxide of $WO_2$ or $WO_3$ is crystallized by being heated at least at 400° C. Further, if heat treat is performed after forming the semiconductor film of the delamination layer 12, hydrogen in the semiconductor film can be diffused. The hydrogen may cause a change in the valence of the metal oxide. Whether the heat treatment is necessary, or the temperature thereof may be determined according to the selected metal of the metal film. If necessary, the metal oxide may be crystallized thereby performing the delamination readily.

Further, heat treatment in a process for manufacturing the semiconductor device may be performed concurrently with the heat treatment of the above step, thereby reducing the number of the steps. For example, the heat treatment may be performed while a crystalline semiconductor film is formed by using a heating oven or laser irradiation.

Figure 1B:
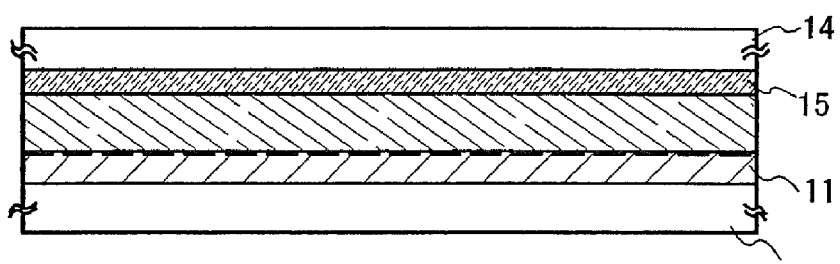

Subsequently, the delamination layer 12 and a second substrate 14 are pasted together with a first adhesive agent 15 as shown in FIG. 1B. Note that it is preferable to use a substrate with rigidity that is higher than that of the first substrate 10 for the second substrate 14. For example, a peelable adhesive agent such as a ultraviolet peelable type that is removed by ultraviolet rays, a heat peelable type that is removed by heat, a water-soluble adhesive that is removed by water; or a two-sided tape may preferably be employed for the first adhesive agent 15.

Figure 1C:
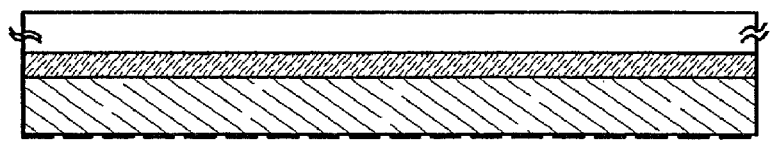

The first substrate 10 provided with the metal film 11 is separated by using physical means (FIG. 1C). The separation occurs in a layer of the crystallized metal oxide or at the boundaries (interfaces) at both surfaces of the metal oxide, that is, at the interface between the metal oxide layer and the metal film or at the interface between the metal oxide and the delamination layer; although it is not illustrated since the figure shows a frame format. Thus, the delamination layer 12 can be separated from the first substrate 10.

It is preferable to cut a part of the substrate and to scratch the delamination interface on the cut surface, that is, the vicinity of the interface between the metal film and the metal oxide film by using a cutter or the like thereby performing the delamination readily.

Figure 1D:
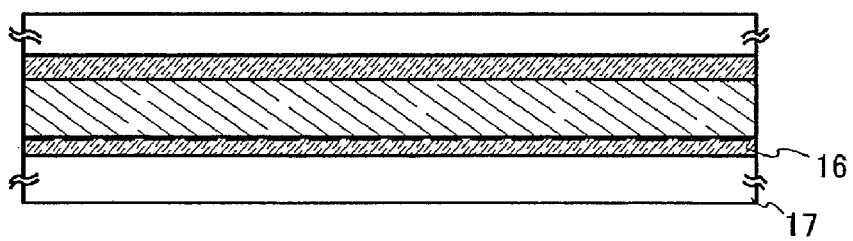

As shown in FIG. 1D, the separated delamination layer 12 is pasted to a third substrate (a label, for example) 17 that is to be a transfer body, with the second adhesive agent 16. An adhesive such as an ultraviolet curable resin, specifically an epoxy resin adhesive, or a resin additive; a two-sided tape; or the like may be used for the second adhesive agent 16. Note that, when the surface of the third substrate is adhesive, the second adhesive agent is not necessary.

A substrate with flexibility or with thin film thickness (such a substrate is hereinafter referred to as a film substrate), for example, a plastic substrate such as a substrate of polyethylene terephthalate, polycarbonate, polyarylate, or polyethersulfone may be used for the third substrate. The irregularities on the surface of the film substrate may be reduced by coating; or rigidity, hardness, or stability thereof may be increased in advance.

Figure 1E:
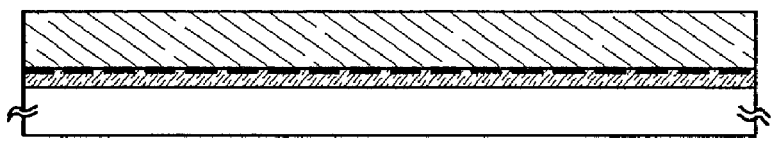

Thereafter, the first adhesive agent 15 is removed and the second substrate 14 is separated (FIG. 1E). Specifically, ultraviolet irradiation, heat treatment, or water washing may be performed to peel the first adhesive agent.

Note that the removal of the first adhesive agent and the curing of the second adhesive agent may be performed in one step. For example, when the first and the second adhesive agents respectively use a heat peelable resin and a thermosetting resin, or an ultraviolet peelable resin and an ultraviolet curable resin, the removal and curing can be performed in one step of heating or ultraviolet irradiation. The adhesive agent can be selected appropriately by an operator in consideration of the transparency of the third substrate and the like.

As described above, the thin film the thin film integrated circuit of the present invention is completed. And thereafter, the thin film integrated circuit is pasted to a product such as a card, a container, or a label, thus acquiring the thin film integrated circuit device, namely a product equipped with the thin film integrated circuit. Needless to say, an IC label in which the thin film integrated circuit is held between labels may be formed and attached (stuck, affixed) to the product. The surface of the product may be curved like the side of a bottle.

Note that the metal oxide 13 would be completely removed form the thin film integrated circuit, or a part or most of the metal oxide 13 would be scattered (remained) on the under surface of the delamination layer. Incidentally, when the metal oxide remains, it may be removed by etching or the like. Further, the oxide film containing silicon may be removed.

Next, an example of a manufacturing method of a thin film integrated circuit device different from FIGS. 1A to 1D, in which an IC label is formed by transferring the delamination layer to the surface of a product will be explained with reference to FIGS. 2A to 2C.

Figure 2A:
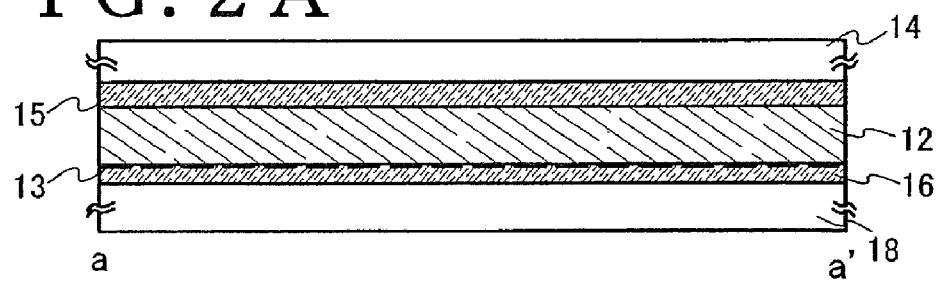
FIGS. 2A to 2C show a manufacturing method of a thin film integrated circuit according to the present invention.

In FIG. 2A, the first substrate is separated, and the delamination layer 12 is transferred to the surface of the product 18 such as a card or a container using the second adhesive agent 16.

Figure 2B:
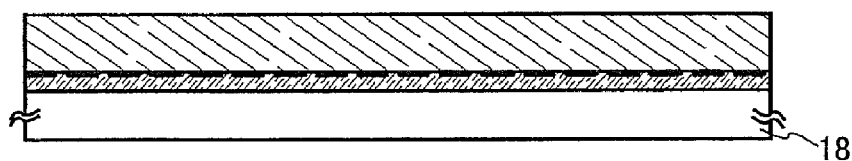

As shown in FIG. 2B, the second substrate 14 is separated. The delamination method is shown in FIGS. 1A to 1E.

Figure 2C:
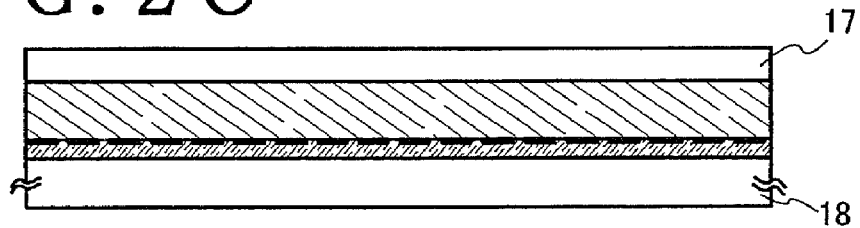

As shown in FIG. 2C, a product equipped with an IC label is completed by sticking a label 17 so as to cover the delamination layer. A label 17 has an adhesive surface and it covers and fixes the thin film integrated circuit. An insulating film containing nitrogen such as a silicon oxynitride (SiNO or SiON) film, a diamond like carbon (DLC) film, or an insulating film containing carbon such as a carbon nitride (CN) film may preferably be formed between the IC and the label. Further, an insulating film containing nitrogen and an insulating film containing carbon may be laminated alternatively. More preferably, a protective film is preferably provided so as to cover a whole product.

Using the methods above, a plurality of thin film integrated circuits are formed from one large scaled substrate. Consequently, a thin film integrated circuit device can be manufactured at a low cost.

Other than the delamination and transfer described above, the manufacturing method of the thin film integrated circuit of the present invention, may alternatively employ a step of separating the delamination layer from the first substrate by laser irradiation, or etching the first substrate and transferring it to the third substrate.

Such an integrated circuit according to the present invention is greatly thin since it is formed from a thin semiconductor film with a thickness of 250 nm to 750 nm, preferably 500 nm at most, while an IC formed from a silicon wafer with a film thickness of around 50 μm, which is used for an RFID IC tag. For example, when the thin film integrated circuit includes a semiconductor film that is to be an active element, a gate insulating film, a gate electrode, an interlayer insulating film, a wiring of a single layer, and a protective film, a thin film integrated circuit that is drastically thin as 1500 nm to 3000 nm can be formed. As a result, the thin film integrated circuit of the present invention can be pasted to a product such as a card or a container without spoiling the design.

The thin film integrated circuit according to the present invention does not require back-grinding that cause a crack or grinding marks unlike an IC formed from a silicon wafer. The nonuniformity of the film thickness of the thin film integrated circuit depends on the nonuniformity that is generated on film formation of a semiconductor film or the like. Therefore, the nonuniformity of the film thickness of the thin film integrated circuit can be reduced to at most about several hundred nanometers which is considerably less than the nonuniformity that is generated during wafer back-grinding.

Embodiment Mode 2

In this embodiment mode, the structure of a thin film integrate circuit and the principle of a contactless thin film integrated circuit will be explained. The contactless thin film integrated circuit is applied to an IC label that can be read without contact.

First, the principle of the contactless thin film integrated circuit is shown in a block diagram in FIG. 5. A contactless thin film integrated circuit 50 has a CPU 51, a memory 52, an I/O port 53, and a coprocessor 54 and exchanges data via a path 55. Further, the IC has an RFID (wireless) interface 56 and a contactless interface 57. A reader/writer 60 that serves as a reading means has a contactless interface 61 and an interface circuit 62. The IC is held to the reader/writer, and transmission of information or information exchange is performed between the contactless interfaces over radio waves. The transmission of information or information exchange with a host computer is performed by the interface circuit of the reader/writer. The host computer may have a reading/writing means alternatively.

A PROM, an EPROM, or an EEPROM may be used for the memory. The PROM and EPROM can not be written in except when a card is issued. Meanwhile, the EEPOM is rewritable. The memory can be selected from those as usage.

The characteristics of a contactless IC is that the power is supplied by electromagnetic induction (electromagnetic induction) of a coil antenna, mutual induction (electromagnetic coupling), or electrostatic induction (electrostatic coupling). The level of the frequency to receive can be selected by controlling the number of turns of the antenna.

FIG. 3 shows a top view of a specific contactless thin film integrated circuit that has an antenna 31, a current circuit 32, and an integrated circuit area 35 including a CPU 33 and a memory 34, and the like. The antenna is connected to the IC through the current circuit. The current circuit 32, for example, has a structure including a diode and a capacitor, and has a function for converting the alternating current (AC) cycle which antenna receives into the direct current (DC).

Figure 4A:
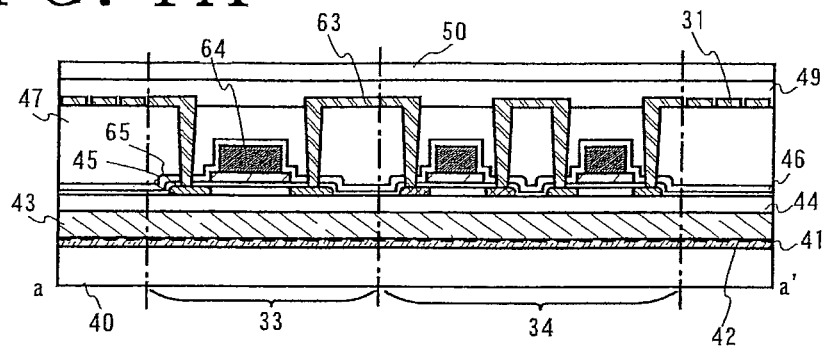
FIGS. 4A to 4C show details of a contactless thin film integrated circuit according to the present invention.
Figure 4B:
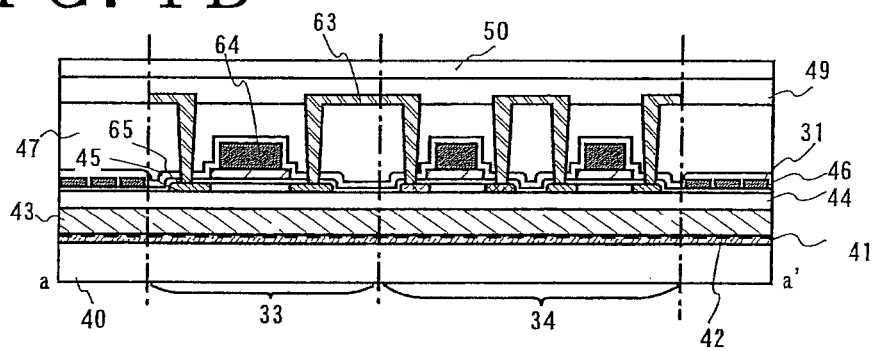
Figure 4C:
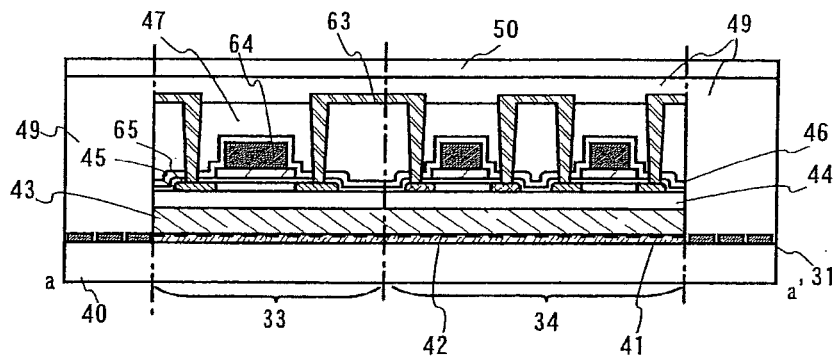
Figure 6A:
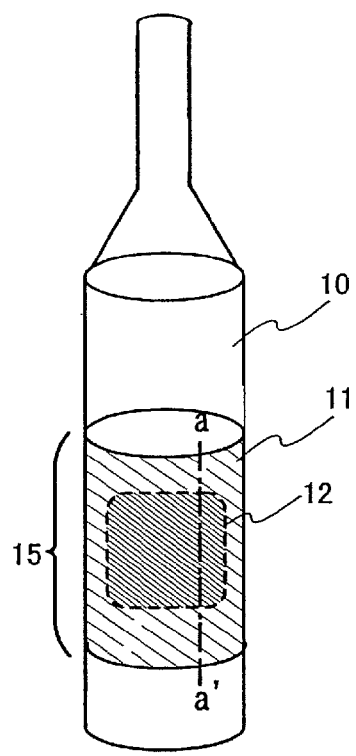
FIGS. 6A to 6C show a product that is equipped with a thin film integrated circuit according to the present invention.
Figure 6B:
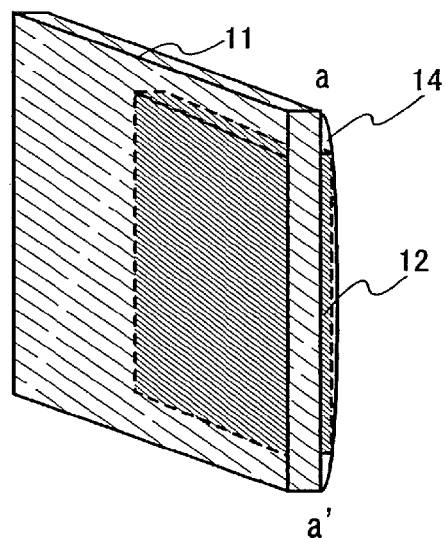
Figure 6C:
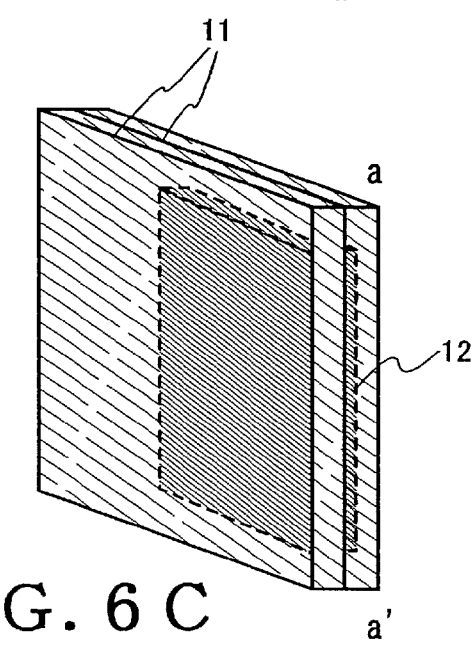

Next, a specific manufacturing method of an IC label is explained with reference to FIGS. 4A to 4C showing a cross section taken along the line a-a' in FIG. 3. In FIGS. 4A to 4C, a thin film integrated circuit is sandwiched between labels as in FIG. 6C.

FIG. 4A shows a structure in which, over an adhesive 41 on a first label 40, a metal oxide 42, an oxide film 43 containing silicon, a base film 44 including an insulating film containing nitrogen, a semiconductor film 45 having an impurity region, a gate electrode 64 over a gate insulating film 65, a first interlayer insulating film 46 covering a gate electrode 64, a second interlayer insulating film 47, a wiring 63 connected to an impurity region, an antenna 31 in the same layer as the wiring 63, protective film 49 covering the wiring and the antenna, and the second label 50 over the protective film are provided. Note that the similar structure without the antenna may be used for a contact thin film integrated circuit.

The semiconductor film, the impurity region, the gate electrode and the like may be formed by using known techniques. For example, the base film has a layered structure of SiNO and SiON; the wiring has a single layer or a layered structure (for example, Ti/Al—Si/Ti) of a metal film containing metal selected from aluminum (Al), titanium (Ti), molybdenum (Mo), tungsten (W) and silicon (Si); a gate electrode has a single layer or a layered structure (for example, W/TaN) including an element selected from tantalum (Ta), tungsten (W), titanium (Ti), molybdenum (Mo), aluminum (Al), and copper (Cu). Further the semiconductor film may be formed from a material containing silicon or silicon germanium; the first interlayer insulating film may be formed from an insulating film (passivation film) containing nitrogen; the second interlayer insulating film may be formed from an inorganic material or an organic material.

An organic resin film having surface smoothness is used for the protective film to improve adhesiveness. Further, an insulating film containing nitrogen, such as a silicon nitride (SiN) film or a silicon oxynitride (SiON or SiNO) film; or an insulating film containing carbon such as DLC or CN, or a lamination of those insulating films may be formed to protect the semiconductor film from impurities.

Thus, the characteristics of the structure shown in FIG. 4A is that the antenna is formed in the same layer as the wiring. The manufacturing conditions of the antenna may be set appropriately. For example, the antenna is formed by etching a predetermined pattern using a wiring material concurrently with the formation of the wiring, by ink jet or a printing method using a conductive paste (specifically, a silver paste), or by pouring an antenna material into a depressed portion that is formed in the second interlayer insulating film and patterning by etchback.

FIG. 4B shows an example of forming an antenna 31 in the same layer as a gate electrode, unlike in the case of FIG. 4A. The antenna is formed by etching a predetermined pattern using a gate material concurrently with the formation of wiring, formed by ink-jet or a printing method using a conductive paste (specifically, silver paste), or pouring an antenna material into a depressed portion that is formed in the first interlayer insulating film or in the gate insulating film. Note that the similar structure without the antenna may be used for a contact thin film integrated circuit.

FIG. 4C shows another example of forming the antenna and the IC area separately, unlike in FIGS. 4A and 4B. The IC having the CPU and the memory are transferred to a predetermined position, and an antenna 31 is formed by ink-jet or by a printing method using a conductive paste (specifically, silver paste). The conductive paste is covered over by a protective film 49. A protective film different from the protective film 49 may be used alternatively. At that point, the antenna and the integrated circuit area may be disposed appropriately. Note that the similar structure without the antenna may be used for a contact thin film integrated circuit.

As to FIGS. 4A to 4C, when the label to which the thin film integrated circuit is transferred is fixed to a product such as a card or a container by means of an adhesive, the label 50 will be replaced by the product. Further, when the thin film integrated circuit is directly transferred to the product, the label 40 will be replaced by the product.

Figure 10A:
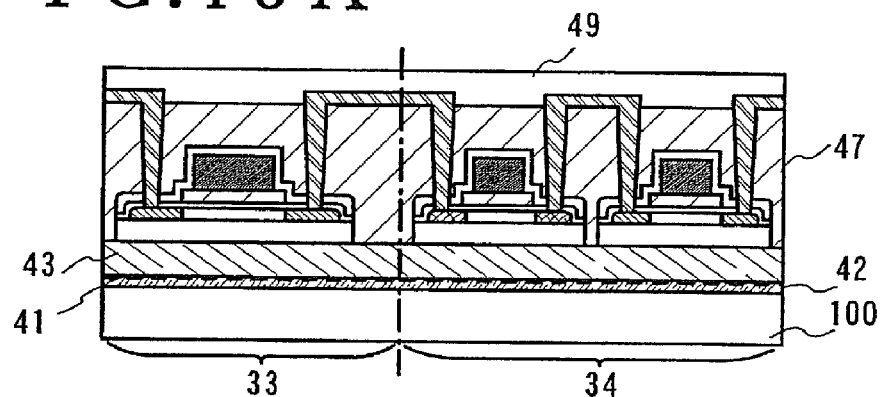
FIGS. 10A to 10C show a manufacturing method of a thin film integrated circuit according to the present invention.
Figure 10B:
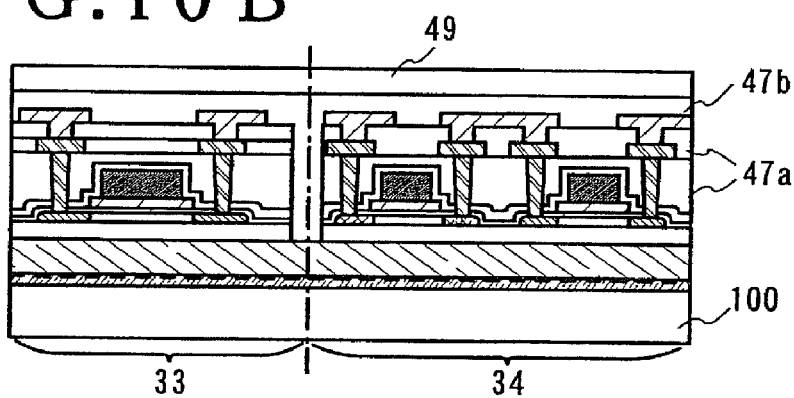
Figure 10C:
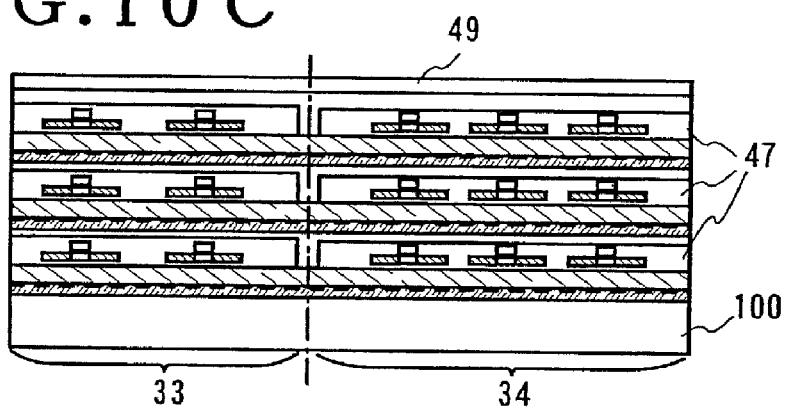

Further in FIGS. 10A to 10C, a configuration example of the case where the thin film integrated circuit is attached to a curved surface. Namely, the configuration prevents stress cracking of semiconductor elements such as a thin film transistor, which occurs when the thin film integrated circuit is deformed by stress. Note that FIGS. 10A to 10C show the area including a CPU 33 and a memory 34 in a thin film integrated circuit that is attached to a product 100, such as a container or a card. Configurations shown in FIGS. 10A to 10C can be applied to anyone of the thin film integrated circuits in FIGS. 4A to 4C each of which is a contact or a contactless type.

First, steps to the formation of a first interlayer insulating film of the thin film transistor are carried out as shown in FIG. 10A. Subsequently, a mask is disposed over a semiconductor film; the first interlayer insulating film, a gate insulating film, and a base film are etched away in the region where the semiconductor film is not provided, thus forming an opening. The etching may be performed in a manner that suits a given selection ratio. For example, dry etching may be applied.

Next, a second interlayer insulating film 47 including an organic material such as polyimide, which has higher elasticity compared with an inorganic material is formed so as to cover the opening. Thus, the semiconductor film including the perimeter (edge) thereof is wrapped with the second interlayer insulating film. Consequently, the stress that occurs during the deformation is concentrated on the second interlayer insulating film having the organic material, and the second interlayer insulating film is primarily deformed; therefore, the stress on the thin film transistor is reduced. Further, when the deformation occurs, the stress is most applied to the edge of the base film instead of the edge of the semiconductor film; thus, the stress concentration at the edge or interface of the semiconductor film can be reduced.

Accordingly, the opening may be preferably formed so that a portion to be most stressed shall be other than the semiconductor film edge, and the portion is not limited to the base film edge. For example, when a lamination of a first and a second base films are provided, stress on the semiconductor may be relieved by forming an opening reaching the first base film. Thus, when respective thin film transistors are separated by forming openings therebetween, the stress can be dispersed diffusely. Therefore, the thin film integrated circuit can be mounted without damaging the semiconductor element, even when the curve of the surface is sharp, namely, when the surface has a small curvature.

The wiring is formed so as to include a metallic material that has high ductility and malleability, more preferably, the film thickness should be thicker thereby withstanding the stress due to the deformation.

The opening is formed between respective thin film transistors in FIG. 10A. However, the isolation may be carried out by forming openings between respective circuit blocks, that is, between respective CPUs or memories. When respective circuit blocks are isolated, it is easier to form the openings compared with the case where respective thin film transistors are isolated. Further, since the openings are not provided between thin film transistors, distance between thin film transistors next to each other is smaller, and the degree of integration can be improved.

Next, an example of forming a plurality of interlayer insulating films and wirings in lamination in a state where respective circuit blocks are isolated is shown. For example, a plurality of second interlayer insulating films 47a and 47b are laminated and wirings for connecting a source electrode and a source wire, and a drain electrode and a drain wire are formed in the lamination. In that case, it is preferable to employ an organic material for the second interlayer insulating films 47a and 47b, at least for the second interlayer insulating film 47b on the top, thereby filling the opening with the organic material. When an organic material is employed only for the second interlayer insulating film on the top, the second interlayer insulating film having the organic material can be formed after heat treatment on the thin film transistor is finished. Thus, a rather low heat-resistant material such as acrylic can be employed, and options of organic materials can be increased.

Next, a thin film integrated circuit having a structure in which respective circuit blocks are isolated and thin film transistors are laminated will be shown. The layered structure may be formed by performing delamination and transfer in a state where thin film transistors are formed according to a method shown in FIGS. 1A to 1E or in FIGS. 2A to 2C. The thin film integrated circuit according to the present invention can be laminated since they have extremely thin film thickness.

For example, in the case of a film integrated circuit having a layered structure as shown in FIG. 10C, every second interlayer insulating film 47 in every thin film transistor is each formed to include a highly elastic organic material. For example, in a structure shown in FIG. 10B, an organic material may be employed for a second interlayer insulating film in each thin film transistor, and an interlayer insulating film of a wiring layer which connects the thin film transistors is also formed from an organic material preferably.

As shown in FIGS. 10A to 10C, an opening is formed, and the second interlayer insulating film including a highly elastic organic material which relieves stress is preferably formed in the opening.

The contactless thin film integrated circuit according to the present invention can be any one of a remote type, a vicinity type, an adjacency type, or a proximity type each of which has a distance from a reader/writer: 2 m or below, 70 cm or below, 10 cm or below, or several cm or below. In view of the operation in a manufacturing site, the adjacency type or the proximity type is preferable.

As for the frequency, microwave for the remote type, 13.56 MHz for the vicinity type and the adjacency type, or 4.91 MHz for the proximity type is generally used. The number of turns of the antenna can be minimized by increasing the frequency and shortening the wavelength.

Contactless power supply and data transmission are performed without contacting with the reader/writer in the contactless thin film integrated circuit as compared with a contact type thin film integrated circuit. Therefore, the contactless thin film integrated circuit can be provided with high durability, and direct damages and errors due to static electricity can be prevented. In addition, it is advantageous that the reader/writer itself is not complex in structure, and the thin film integrated circuit is easy to handle since it only needs to be held to the reader/writer.

Since the contactless or contact thin film integrated circuit that is formed as described above is greatly thin, the design is not spoiled even if it is mounted on a product such as a card or a container. Further, in the case of the contactless thin film integrated circuit, the IC and the antenna can be formed as a unit, and can be directly transferred to a product having a curved surface with ease.

Embodiment Mode 3

In this embodiment mode, a method for reading information as for a product that is equipped with an IC label will be explained. In specific, the case where the IC label is a contactless type will be explained.

A product equipped with an IC label 72 is held to a sensing area 71 of a reader/writer body 70 shown in FIG. 7A. In addition to a material, the place of production, a test result of each production (manufacturing) process, a record of distribution process, and the like; information on a product such as a description of the product are displayed in a display area. The display area is not necessarily provided in the reader/writer, and may be formed separately. Such a reader/writer may be provided on a display rack.

As shown in FIG. 7B, for example, a personal digital assistant such as a cellular phone 80 is provided with a reading function therein; a product including an IC label 82 is held to a sensing area 81 that is installed in the main body. Then, information is displayed in a display area 83. Information on a product is displayed as well. The display area is not necessarily provided in the personal digital assistant that serves as a reader/writer, and may be formed separately.

Further as shown in FIG. 7C, a product equipped with an IC label 92 is held to a sensing area 91 of a portable reader 90. Then, information is displayed in a display area 93. Information on a product is displayed as well. The display area is not necessarily provided in the reader/writer, and may be formed separately.

A reader/writer of a contactless type is explained as above. As for a contact type, information may be displayed in a display area in a like manner. Further, the display area may be provided in the product that is equipped with a contactless or a contact thin film integrated circuit.

Thus, a consumer can obtain rich information on a product freely in comparison with information provided by an RFID IC tag. The product management can be performed accurately and quickly using the thin film integrated circuit.

Embodiment Mode 4

In this embodiment mode, a management method of a product having IC label and flow of information and products will be explained. In specific, the case where the IC label is a contactless type will be explained here.

Figure 8:
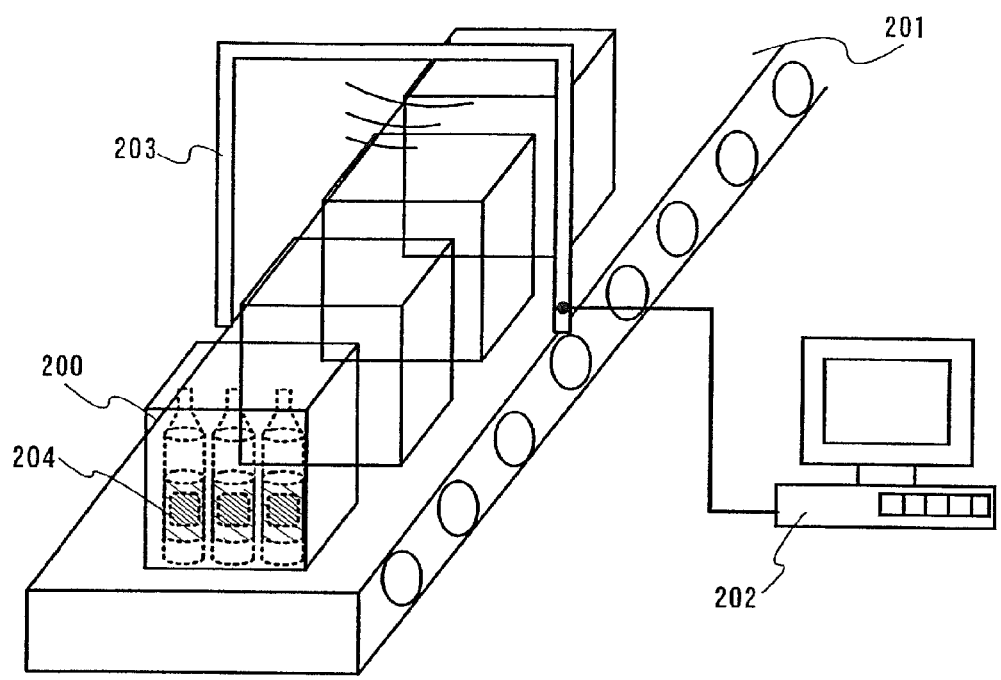
FIG. 8 shows a state of reading a product that is equipped with an IC label according to the present invention.

As shown in FIG. 8, before product shipment by a manufacturer or before product display by a seller, the information necessary for product management is inputted to a host computer. For example, a cardboard box that is packed with a plurality of products 200 each of which is equipped with an IC label 204 is swiped with a reader/writer 203 by using a transportation means 201 like a belt conveyor, and the information on the products can be inputted to the computer. In that case, the reader/writer may be directly connected to the computer. Input using the reader/writer may be carried out per each product instead of per each cardboard box.

The great amounts of data on products, which are stored in the thin film integrated circuit can be immediately inputted to a computer 202. The computer is equipped with software having a function of processing the data on the products. The data processing can be performed with hardware. As a result, errors, work, and time on the data processing can be reduced and the burden of product management can be lightened.

The flow of information and products between a producer (manufacturer), a seller, and a customer is shown in FIG. 9. A producer (manufacturer) provides a seller or customers with a product equipped with a thin film integrated circuit. The seller can provide the producer (manufacturer) with, for example, information on prices, the number of the sold products, or the time of purchase. Meanwhile, the customer can provide purchase information such as personal information. For example, the purchase information can be provided to the producer (manufacturer) over the net by using a credit card equipped with the thin film integrated circuit or a reader which an individual owns.

Further, the seller can provide the customers with product information, and the customers can provide the seller with purchase information by means of the thin film integrated circuit. Such sales information, purchase information, or the like are valuable and will be useful in the future sales strategy.

A method of disclosing information on the thin film integrated circuit which is read with a reader owned by the seller or the customer to the producer (manufacturer), the seller, or the customer via a computer or a network, can be given as a way to provide various information.

Thus, various information can be provided to someone in need. The thin film integrated circuit according to the present invention is also advantageous to commodity trading or product management.

The thin film integrated circuit that has greatly thin thickness according to the present invention makes it possible to carry out information exchange or information management easily and quickly. And various information can be provided to someone in need. Further, the thin film integrated circuit is thin enough that the design is not spoiled even when the IC label is incorporated in a product container.

Unlike an IC formed from a silicon wafer that is installed in an RFID IC tag, back-grinding that cause a crack or grinding marks is not necessary. Further, the nonuniformity of the film thickness of the thin film integrated circuit depends on the nonuniformity that is generated on film formation of each film forming an IC. Therefore, the nonuniformity of the film thickness of the thin film integrated circuit can be reduced to at most about several hundred nanometers which is considerably less than the nonuniformity of several to several dozen μm which is generated during wafer back-grinding.

What is claimed is:
1. An article comprising:
a sensor portion configured to receive information wirelessly from a flexible integrated circuit,
wherein the flexible integrated circuit comprises an antenna and a transistor including an impurity region, which are disposed over a substrate with flexibility, and wherein the antenna is formed in a same layer as a wiring directly connected to the impurity region.

2. The article according to claim 1, wherein the substrate with flexibility is a plastic substrate.

3. The article according to claim 1, wherein the transistor includes a semiconductor film comprising silicon.

4. The article according to claim 1, wherein nonuniformity of a film thickness of the flexible integrated circuit is at most several hundred nanometers.

5. The article according to claim 1, wherein the article is a cellular phone provided with a reading function.

6. The article according to claim 1, wherein the article is a reader/writer of a contactless type.

7. An article comprising:
a sensor portion configured to receive information wirelessly from a flexible integrated circuit,
wherein the flexible integrated circuit comprises an antenna and a transistor including an impurity region, which are disposed over a substrate with flexibility,
wherein the antenna is formed in a same layer as a wiring directly connected to the impurity region, and
wherein a thickness of the flexible integrated circuit is 1500 nm to 3000 nm.

8. The article according to claim 7, wherein the substrate with flexibility is a plastic substrate.

9. The article according to claim 7, wherein the transistor includes a semiconductor film comprising silicon.

10. The article according to claim 7, wherein nonuniformity of a film thickness of the flexible integrated circuit is at most several hundred nanometers.

11. The article according to claim 7, wherein the article is a cellular phone provided with a reading function.

12. The article according to claim 7, wherein the article is a reader/writer of a contactless type.

13. An information receiving system comprising:
an article comprising a sensor portion configured to receive information wirelessly from a flexible integrated circuit,
wherein the flexible integrated circuit comprises an antenna and a transistor including an impurity region, which are disposed over a substrate with flexibility, and
wherein the antenna is formed in a same layer as a wiring directly connected to the impurity region.

14. The information receiving system according to claim 13, wherein the substrate with flexibility is a plastic substrate.

15. The information receiving system according to claim 13, wherein the transistor includes a semiconductor film comprising silicon.

16. The information receiving system according to claim 13, wherein nonuniformity of a film thickness of the flexible integrated circuit is at most several hundred nanometers.

17. The information receiving system according to claim 13, wherein the article is a cellular phone provided with a reading function.

18. The information receiving system according to claim 13, wherein the article is a reader/writer of a contactless type.

19. An information receiving system comprising:
an article comprising a sensor portion configured to receive information wirelessly from a flexible integrated circuit,
wherein the flexible integrated circuit comprises an antenna and a transistor including an impurity region, which are disposed over a substrate with flexibility,
wherein the antenna is formed in a same layer as a wiring directly connected to the impurity region, and
wherein a thickness of the flexible integrated circuit is 1500 nm to 3000 nm.

20. The information receiving system according to claim 19, wherein the substrate with flexibility is a plastic substrate.

21. The information receiving system according to claim 19, wherein the transistor includes a semiconductor film comprising silicon.

22. The information receiving system according to claim 19, wherein nonuniformity of a film thickness of the flexible integrated circuit is at most several hundred nanometers.

23. The information receiving system according to claim 19, wherein the article is a cellular phone provided with a reading function.

24. The information receiving system according to claim 19, wherein the article is a reader/writer of a contactless type.

* * * * *